(12) United States Patent
Chang

(10) Patent No.: US 6,548,384 B2
(45) Date of Patent: Apr. 15, 2003

(54) METHOD FOR PERFORMING LITHOGRAPHIC PROCESS TO A MULTI-LAYERED PHOTORESIST LAYER

(75) Inventor: Ching-Yu Chang, I-Lan (TW)

(73) Assignee: Macronix International Co. LTD (TW)

( * ) Notice: Subject to any disclaimer, the term of this patent is extended or adjusted under 35 U.S.C. 154(b) by 0 days.

(21) Appl. No.: 09/854,959

(22) Filed: May 14, 2001

(65) Prior Publication Data

US 2002/0168838 A1 Nov. 14, 2002

(51) Int. Cl.[7] ............................................... H01L 21/22
(52) U.S. Cl. ........................................................ 438/551
(58) Field of Search ................................. 438/551, 689, 438/745, 706

(56) References Cited

U.S. PATENT DOCUMENTS 5,277,749 A * 1/1994 Griffith et al. ................ 216/40
6,136,679 A * 10/2000 Yu et al. ...................... 438/592
6,207,333 B1 * 3/2001 Adair et al. ................... 430/51
6,290,858 B1 * 9/2001 Hirtreiter et al. ............... 216/2

\* cited by examiner

Primary Examiner—David Nelms
Assistant Examiner—Thao P Le

(57) ABSTRACT

A method for performing lithographic process to a multi-layered photoresist layer. The method at least includes the following steps. First of all, a substrate is provided. Then, a first photoresist film is formed on the substrate, and a mask layer is formed on the first photoresist film, wherein the mask layer is different from the first photoresist film. Next, a second photoresist film is formed on the mask layer, and a pattern is transferred into the second photoresist film by using lithographic process. Then, the mask layer is etched by using the second photoresist film as a first mask such that the pattern is transferred into layer. Finally, the pattern is transferred into the first photoresist film by using the mask layer as a second mask.

10 Claims, 3 Drawing Sheets

METHOD FOR PERFORMING LITHOGRAPHIC PROCESS TO A MULTI-LAYERED PHOTORESIST LAYER

BACKGROUND OF THE INVENTION

1. Field of the Invention

The present invention generally relates to a method for forming a semiconductor device, and more particularly to a method for performing lithographic process to a multi-layered photoresist layer.

2. Description of the Prior Art

For an introduction into semiconductor devices, the size of semiconductor devices have been continuously shrinking, resulting in a smaller semiconductor chip size with increased device density on the chip. The scale of the device substantially depends on the optical resolution of the photolithography process. The resolution is proportional to the wavelength of the exposure and inverse to the numerical aperture (NA) of the exposure device; i.e., $R=k1\ (\lambda/NA)$, that means a better resolution analysis can be abstained by using a light source with a short wavelength or exposure device with large a numerical aperture (NA).

Because depth of focus $(DOF)=k_2\ (\lambda/NA^2)$, When a light source with short wavelength or lens with large numerical aperture (NA) is used, depth of focus (DOF) is unacceptable. Therefore, it is the most important critical point in photolithography that how to use resolution in combination with depth of focus (DOF) to obtain the preferred process conditions.

With the increase process complexity, substrate of the wafer upon which the pattern is imaged is typically non-planar, primarily because of non-uniformities in the starting wafer surface and topographies creased by deposition and etching steps during processing. However, as the plane of image departs from the plane of optimal focus in the resist, the image quality deteriorates. Therefor, it is another important detail to be solved in photolithography. That pattern needs to be imaged on non-planer surface of a photoresist layer.

For the forgoing reasons, there is a need for a method that will increase both resolution and depth of focus (DOF) in photolithography is necessary.

SUMMARY OF THE INVENTION

In accordance with the present invention, a method is provided for performing lithographic process to a multi-layered photoresist layer that substantially can be used to increase resolution in conventional process.

One object of the present invention is to provide a method for performing lithographic process to a multi-layered photoresist layer to increase resolution.

Another object of the present invention is to provide a method for performing lithographic process to a multi-layered photoresist layer to increase process depth of focus window.

In order to achieve the above object, the present invention provides a method for performing a lithographic process to a multi-layered photoresist layer. The method at least includes the following steps. First of all, a substrate is provided. Then, the first photoresist film is formed on the substrate, and a mask layer is formed on the first photoresist film, wherein the mask layer is different from the first photoresist film. Next, a second photoresist film is formed on the mask layer, and a pattern is transferred into the second photoresist film by using a lithographic process. Then, the mask layer is etched by using the second photoresist film as a first mask such that the pattern is transferred into a mask layer. Finally, the pattern is transferred into the first photoresist film by using the mask layer as a second mask.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

Some embodiments of the invention will now be described in greater detail. Nevertheless, it should be recognized that the present invention can be practiced in a wide range of other embodiments besides those explicitly described, and the scope of the present invention is not expressly limited except as specified in the accompanying claims.

FIG. 1A to FIG. 1E are cross-sectional views of a method for performing lithographic process to a multi-layered photoresist layer in accordance with one preferred embodiment of the present invention.

Figure 1A:
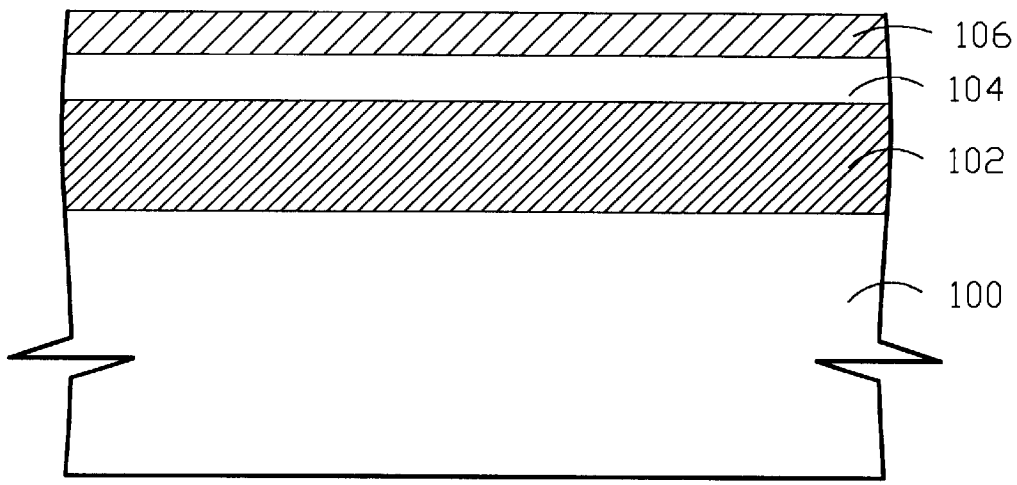
FIG. 1A to FIG. 1E are cross-sectional views of a method for performing lithographic process to a multi-layered photoresist layer in accordance with one preferred embodiment of the present invention.

Referring to FIG. 1A, firstly, a substrate 100 is provided, and a first photoresist film 102 is coated over a substrate 100. The first photoresist film 102 with a thickness between about 3000 angstroms and 10000 angstroms. In the embodiment, thickness of this layer is preferably 7000 angstroms. The material of the photoresist film 102 may be any resist material such as I-line resist, Deep Ultra-Violet Ray (DUV) resist, or E-beam resist. These resists may be used in forming the photoresist layer through lithographic processes that use DUV wavelengths (e.g., 248 nm, 193 nm, etc.) or I-line wavelengths (e.g., 365 nm). Using a smaller or narrower wavelength allows smaller or narrower patterns to be made. Then, a mask layer 104 is deposited on the first photoresist film 102. This mask layer 104 is formed on the photoresist film 102 by the "$SiH_4+H_2O_2 \rightarrow SiO_2$". This mask layer 104 may be silicon dioxide at reaction temperature of about 25° C. with a thickness greater than 50 angstroms. This mask layer 104 is silicon dioxide, photoresist, polymer, silicon nitride, doping boron phosphorous silicide or organic silicide. Next, a second photoresist film 106 is coated over the mask layer 104. The second photoresist film 106 with a thickness between 500 angstroms and 1000 angstroms. In the embodiment, thickness of this layer is preferably 1000 angstroms. The material of the photoresist film 106 may be any resist material such as I-line resist, Deep Ultra-Violet Ray (DUV) resist, and E-beam resist. These resists may be used in forming the photoresist layer through lithographic processes that use DUV wavelengths (e.g., 248 nm, 193 nm, etc.) or I-line wavelengths (e.g., 365 nm). Using a smaller or narrower wavelength allows smaller or narrower patterns to be made.

Figure 1B:
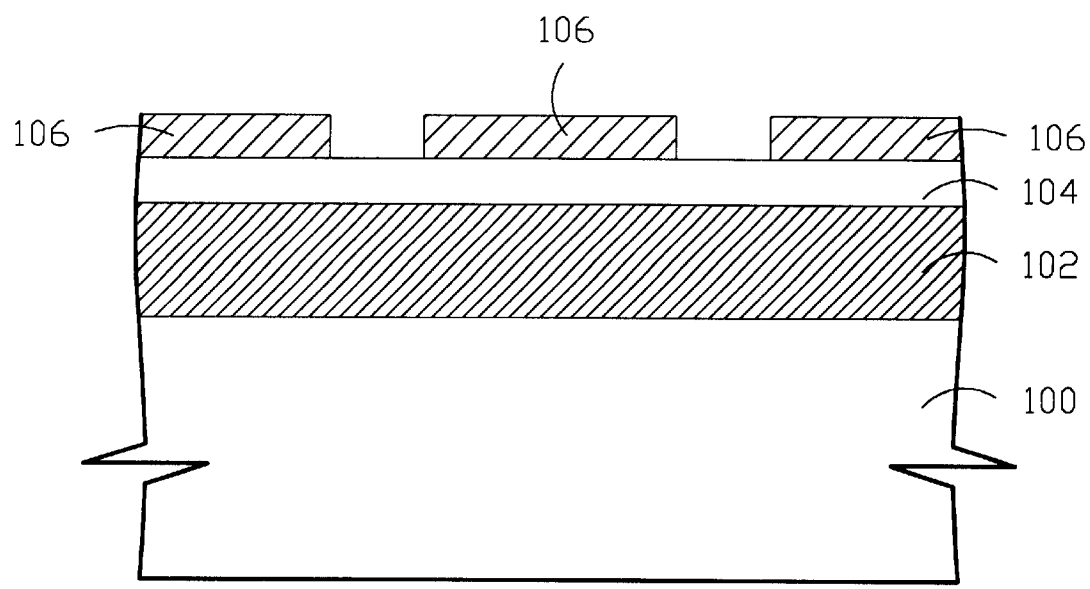

Referring to FIG. 1B, the second photoresist film 106 is shown as a first mask over portions of the mask layer 104 and includes the photoresist film portions 106. The second photoresist film 106 is made of a photoresist material, which may be spin-coated, and patterned to form a photomask through exposure and development. Once developed, the photomask will serve as a mask to define the etching locations over the mask layer 104.

Figure 1C:
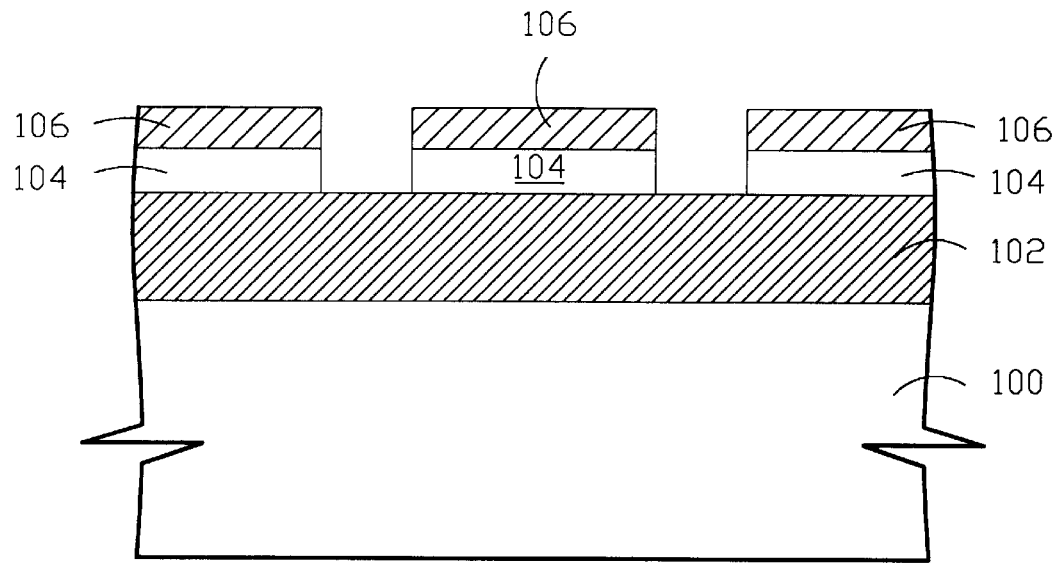

Referring to FIG. 1C, the second photoresist film 106 is used as a mask to etch the layer 104 and includes the mask layer portions 104 on the first photoresist film 102. The mask layer 104 may be formed by dry etching method. Also, the mask layer 104 may be formed by wet etching method.

Figure 1D:
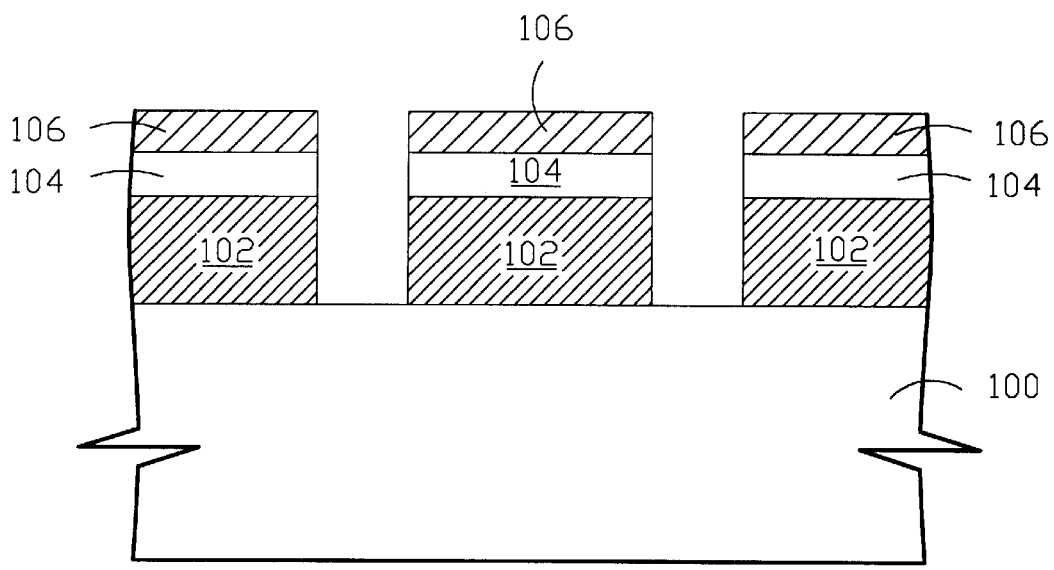
Figure 1E:
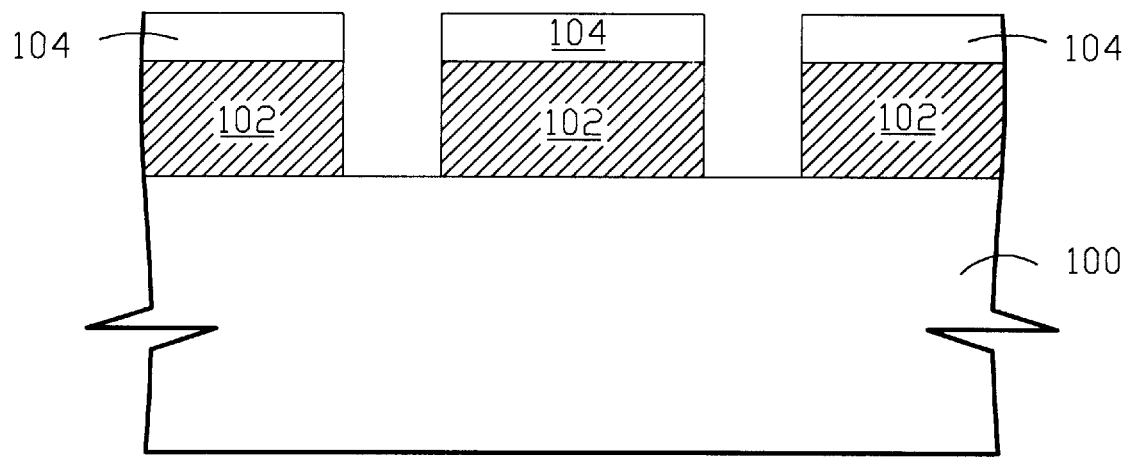

Referring to FIG. 1D, the mask layer 104 is used as another mask to etch the first photoresist film 102 and includes the first photoresist film portions 102 on the substrate 100. The suitable method to form this first photoresist film 102 can be $O_2$ plasma method. Then, referring to FIG. 1E, the second photoresist film 106 is removed from the mask layer 104.

The method for performing lithographic process to a multi-layered photoresist layer using the above explained method, has the following advantages:

1. The present invention is to provide a method for performing lithographic process to a multi-layered photoresist layer that means patterned photoresist with minute line width that can be formed by increasing both numerical aperture (NA) and optics resolution because requirement conditions of the depth of focus (DOF) is reduced.
2. The present invention is to provide a method for performing lithographic process to a multi-layered photoresist layer that only exposes the second photoresist layer of thin under-layer. Therefor, it is important in photolithography that pattern needs to be imaged on non-planer surface of a photoresist layer.

Although a specific embodiment have been illustrated and described, it will be obvious to those skilled in the art that various modifications may be made without departing from what is intended to be limited solely by the appended claims.

What is claimed is:

1. A method for forming a photoresist pattern, the method comprising the steps of:
   providing a substrate;
   forming a first photoresist film on said substrate;
   forming a mask layer on said first photoresist film, wherein said layer is different from said first photoresist film;
   forming a second photoresist film on said mask layer;
   transferring a pattern into said second photoresist film by using a lithographic process;
   etching said mask layer by using said second photoresist film as a first mask such that said pattern is transferred into said mask layer;
   transferring said pattern into said first photoresist film by using said mask layer as a second mask;
   etching said substrate by using said first photoresist film as a third mask; and removing said second photoresist film from said mask layer.

2. The method according to claim 1, wherein said first photoresist film is selected from the group consisting of I-line resist, Deep Ultra-Violet Ray resist, and E-beam resist.

3. The method according to claim 1, wherein thickness of said first photoresist film is greater than 1000 angstrom.

4. The method according to claim 1, wherein said mask layer is selected from the group consisting of silicon dioxide, polymer, photoresist, silicon nitride, doping boron phosphorous silicide, and organic silicide.

5. The method according to claim 1, wherein thickness of said mask layer is greater than 50 angstrom.

6. The method according to claim 1, wherein said second photoresist film is selected from the group consisting of I-line resist, Deep Ultra-Violet Ray resist, and E-beam resist.

7. The method according to claim 1, wherein thickness of said second photoresist film is greater than 500 angstrom.

8. The method according to claim 1, wherein said step of etching said mask layer is dry etching.

9. The method according to claim 1, wherein said step of etching said mask layer is wet etching.

10. The method according to claim 1, wherein said first photoresist pattern is formed by $O_2$ plasma method.

* * * * *